(12) United States Patent
Ranish et al.

(10) Patent No.: US 7,509,035 B2
(45) Date of Patent: Mar. 24, 2009

(54) LAMP ARRAY FOR THERMAL PROCESSING EXHIBITING IMPROVED RADIAL UNIFORMITY

(75) Inventors: Joseph M. Ranish, San Jose, CA (US); Corina E. Tanasa, Mountain View, CA (US); Sundar Ramamurthy, Fremont, CA (US); Claudia Lai, Sunnyvale, CA (US); Ravi Jallepally, Santa Clara, CA (US); Ramachandran Balasubramanian, Santa Clara, CA (US); Aaron M. Hunter, Santa Cruz, CA (US); Agus Tjandra, San Jose, CA (US); Norman Tam, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 290 days.

(21) Appl. No.: 11/195,395

(22) Filed: Aug. 2, 2005

(65) Prior Publication Data

US 2006/0066193 A1   Mar. 30, 2006

Related U.S. Application Data

(60) Provisional application No. 60/613,289, filed on Sep. 27, 2004.

(51) Int. Cl.
*F26B 19/00* (2006.01)
*F27B 5/14* (2006.01)

(52) U.S. Cl. .......... 392/416; 219/390; 219/405; 219/411; 392/418; 118/724; 118/725; 118/50.1

(58) Field of Classification Search .......... 219/390, 219/405, 411; 392/416, 418; 118/724, 725, 118/50.1
See application file for complete search history.

(56) References Cited

U.S. PATENT DOCUMENTS

| | | | |
|---|---|---|---|
| 4,356,384 A | 10/1982 | Gat | 219/347 |
| 5,767,486 A | 6/1998 | Gronet et al. | 219/411 |
| 6,108,490 A | 8/2000 | Lee et al. | 392/416 |
| 6,167,195 A * | 12/2000 | Moslehi et al. | 392/418 |
| 6,376,804 B1 | 4/2002 | Ranish et al. | 219/390 |
| 6,879,777 B2 * | 4/2005 | Goodman et al. | 392/411 |
| 7,075,037 B2 * | 7/2006 | Shimizu et al. | 219/390 |
| 2004/0079746 A1 | 4/2004 | Jennings et al. | 219/390 |

* cited by examiner

*Primary Examiner*—Shawntina Fuqua
(74) *Attorney, Agent, or Firm*—Law Office of Robert M. Wallace

(57) ABSTRACT

A thermal processing chamber includes a substrate support rotating about a center axis and a lamphead of plural lamps in an array having a predetermined difference in radiance pattern between them. The radiance pattern includes a variation in diffuseness or collimation. In one embodiment, the center lines of all of the lamps are disposed away from the center axis. The array can be an hexagonal array, in which the center axis is located at a predetermined position between neighboring lamps.

9 Claims, 14 Drawing Sheets

US 7,509,035 B2

LAMP ARRAY FOR THERMAL PROCESSING EXHIBITING IMPROVED RADIAL UNIFORMITY

CROSS REFERENCE TO RELATED APPLICATIONS

This application claims the benefit of U.S. Provisional Application No. 60/613,289, filed Sep. 27, 2004.

BACKGROUND OF THE INVENTION

1. Field of the Invention

The invention relates generally to radiant thermal processing of substrates such as semiconductor wafers. More particularly, the invention relates to the lamp array used in producing the radiation for such thermal processing.

2. Background Art

Rapid thermal processing (RTP) is a term applied to several related high-temperature processes including annealing, dopant activation, oxidation, and nitridation among others. It can be further applied to etching and chemical vapor deposition in the presence of precursor or etching gases. RTP typically depends upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps. Thereby, the processing time at a predetermined temperature can be more closely controlled and the total thermal budget can be reduced. Furthermore, the total processing time can be reduced, thereby increasing throughput.

SUMMARY OF THE INVENTION

A thermal processing chamber includes a substrate support rotating about a center axis and a lamphead of plural lamps in an array having a predetermined difference in radiance pattern between them. The radiance pattern includes a variation in diffuseness or collimation. In one embodiment, the center lines of all of the lamps are disposed away from the center axis. The array can be a hexagonal array, in which the center axis is located at a predetermined position between neighboring lamps.

BRIEF DESCRIPTION OF THE DRAWINGS

FIG. 3AA illustrates a wound filament.

FIG. 3AB illustrates a double wound filament.

FIG. 3AC illustrates a triple wound filament.

FIG. 3AD illustrates a lamp bulb that can be used in the lamphead of FIG. 2 with a filament according to FIG. 3AC.

DETAILED DESCRIPTION OF THE INVENTION

Figure 1:
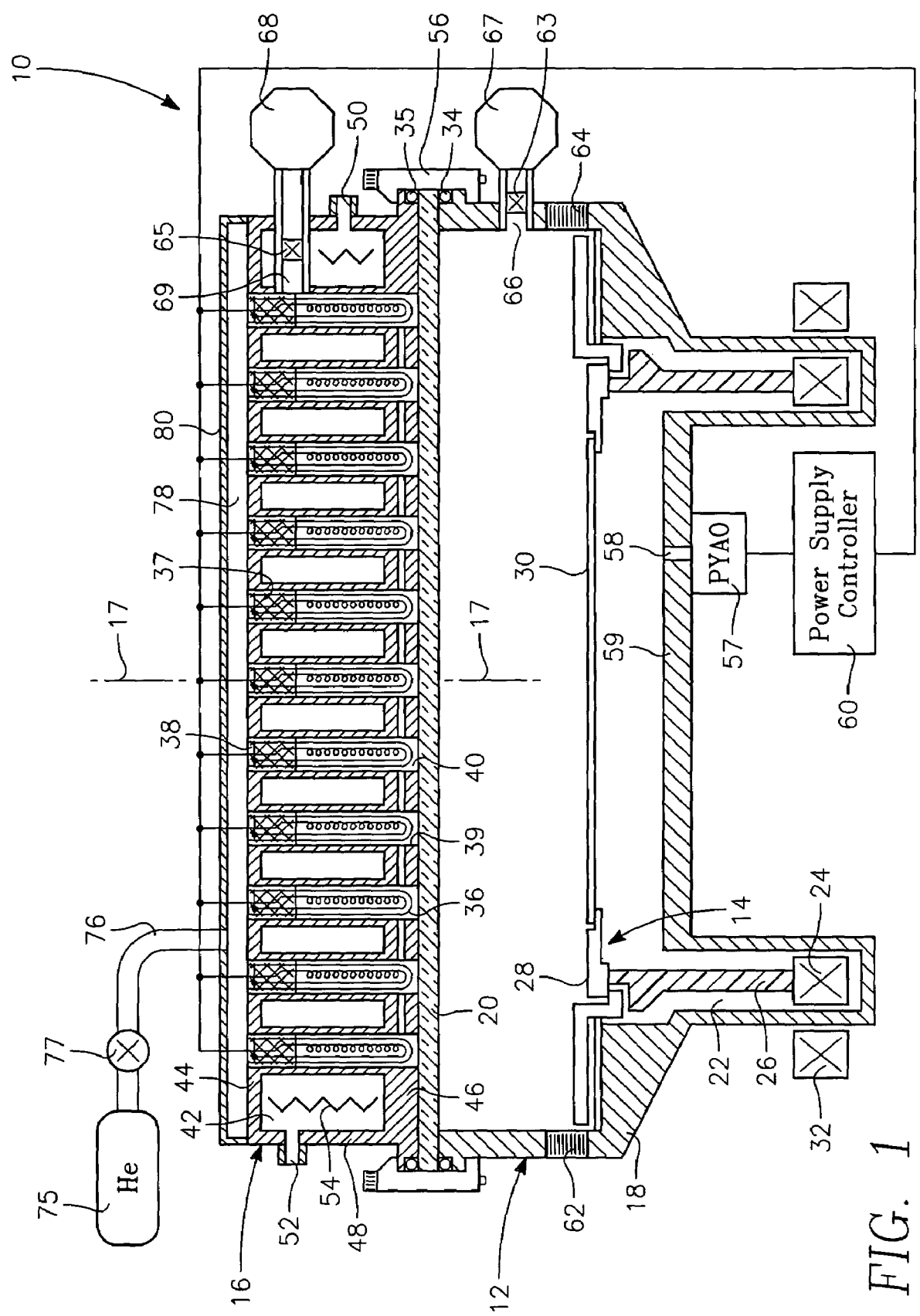
FIG. 1 is a cut-away side view of a thermal processing chamber.

FIG. 1 schematically illustrates in cross section an RTP reactor 10 described by Ranish et al. in U.S. Pat. No. 6,376,804, incorporated herein by reference and generally representative of the Radiance RTP reactor available from Applied Materials, Inc. of Santa Clara, Calif. The reactor 10 includes a processing chamber 12, a wafer support 14 located within chamber 12, and a lamphead 16 or heat source assembly located on the top of the chamber 12, all generally symmetrically arranged about a central axis 17.

The processing chamber includes a main body 18 and a window 20 resting on the main body 18. The window 20 is made of a material that is transparent to infrared light, for example, clear fused silica quartz.

The main body 18 is made of stainless steel and may be lined with quartz (not shown). A circular channel 22 is formed near the bottom of the main body 18. The wafer support 14 includes a magnetic rotor 24 within the channel 22, a quartz tubular riser 26 resting on or other coupled to the magnetic rotor 24, and a silicon-coated silicon carbide, opaque silicon carbide or graphite edge ring 28 resting on the riser 26. During processing, a wafer 30 or other substrate rests on the edge ring 28. A magnetic stator 32 is located externally of the magnetic rotor 24 and is magnetically coupled through the main body 18 to induce rotation of the magnetic rotor 24 and hence of the edge ring 28 and supported wafer 30 about the central axis 17.

The quartz window 20 rests on an upper edge of the main body 18 and an O-ring 34 located between the window 20 and the main body 18 provides an air-tight seal between them. The lamphead 16 overlies the window 20. Another O-ring 35 located between the window 20 and lamphead 16 provides an airtight seal between them. The lamphead 16 includes a plurality of lamps 36 that are supported by and electrically powered through electrical sockets 38. The lamps 36 are preferably incandescent bulbs that emit strongly in the infrared such as tungsten halogen bulb having a tungsten filament inside a quartz bulb filled with a gas containing a halogen gas such as bromine and diluted with an inert gas to clean the quartz bulb. Each bulb is potted with a ceramic potting compound 37, which is relatively porous. The lamps 36 are located inside vertically oriented cylindrical lamp holes 39 formed on a reflector body 40. More details of the reflector structure will be provided later. The open ends of the lamp holes 39 of the reflector body 40 are located adjacent to but separated from the window 20.

A cooling chamber 42 is defined within the reflector body 40 by upper and lower chamber walls 44, 46 and a cylindrical wall 48 and surrounds each of the lamp holes 39. A coolant, such as water, introduced into the chamber via an inlet 50 and removed at an outlet 52 cools the reflector body 40 and traveling adjacent the lamp holes 39 cools the lamps 36. Baffles 54 may be included to ensure proper flow of the coolant through the chamber. Clamps 56 secure and seal the window 20, the lamphead 16, and the main chamber body 18 to one another.

Thermal sensors such as seven pyrometers 57 optically coupled to and disposed adjacent respective apertures 58 in a reflector plate 59 and supported in the main body 18 detect a temperature or other thermal property of a different radial portion of the lower surface of the wafer 30, as Peuse et al. describes in U.S. Pat. No. 5,755,511. The pyrometers 57 are connected to a power supply controller 60, which controls the power supplied to the infrared lamps 36 in response to the measured temperatures. The infrared lamps 36 may be controlled in radially arranged zones, for example, fifteen zones, to provide a more tailored radial thermal profile to account for thermal edge effects. All the pyrometers 57 provide signals indicative of a temperature profile across the wafer 30 to the power supply controller 60, which controls the power supplied to each of the zones of the infrared lamps 36 in response to a measured temperature.

The main body 18 of the processing chamber 12 includes a processing gas inlet port 62 and a gas outlet port 64. In use, the pressure within the processing chamber can be reduced to a sub-atmospheric pressure prior to introducing a process gas through the inlet port 62. The process chamber is evacuated by pumping through a port 66 by means of a vacuum pump 67 and a valve 63. The pressure is typically reduced to between about 1 and 160 torr. Certain processes, however, can be run at atmospheric pressure, though often in the presence of a specified gas, and the process chamber does not need to be evacuated for such processes.

Another vacuum pump 68 reduces the pressure within the lamphead 16, particularly when the processing chamber is pumped to a reduced pressure to reduce the pressure differential across the quartz window 20. The pressure within the lamphead 16 is reduced by pumping though a port 69 including a valve 65, which extends through the cooling chamber 42 and is in fluid communication with an interior space of the reflector body 40.

A pressurized source 75 of a thermally conductive gas, such as helium, fills the lamphead 16 with the thermally conductive gas to facilitate thermal transfer between the lamps 36 and the cooling channels 42. The helium source 75 is connected to the lamphead 16 through a port 76 and a valve 77. The thermally conductive gas is introduced into a space 78 formed between a lamphead cover 80 and the base of each lamp 36. Opening the valve 77 causes the gas to flow into this space 78. Since the lamp potting compound 37 is porous, the thermally conductive gas flows through the potting compound 37 and around the walls of each lamp 36 to cool it.

Figure 2:
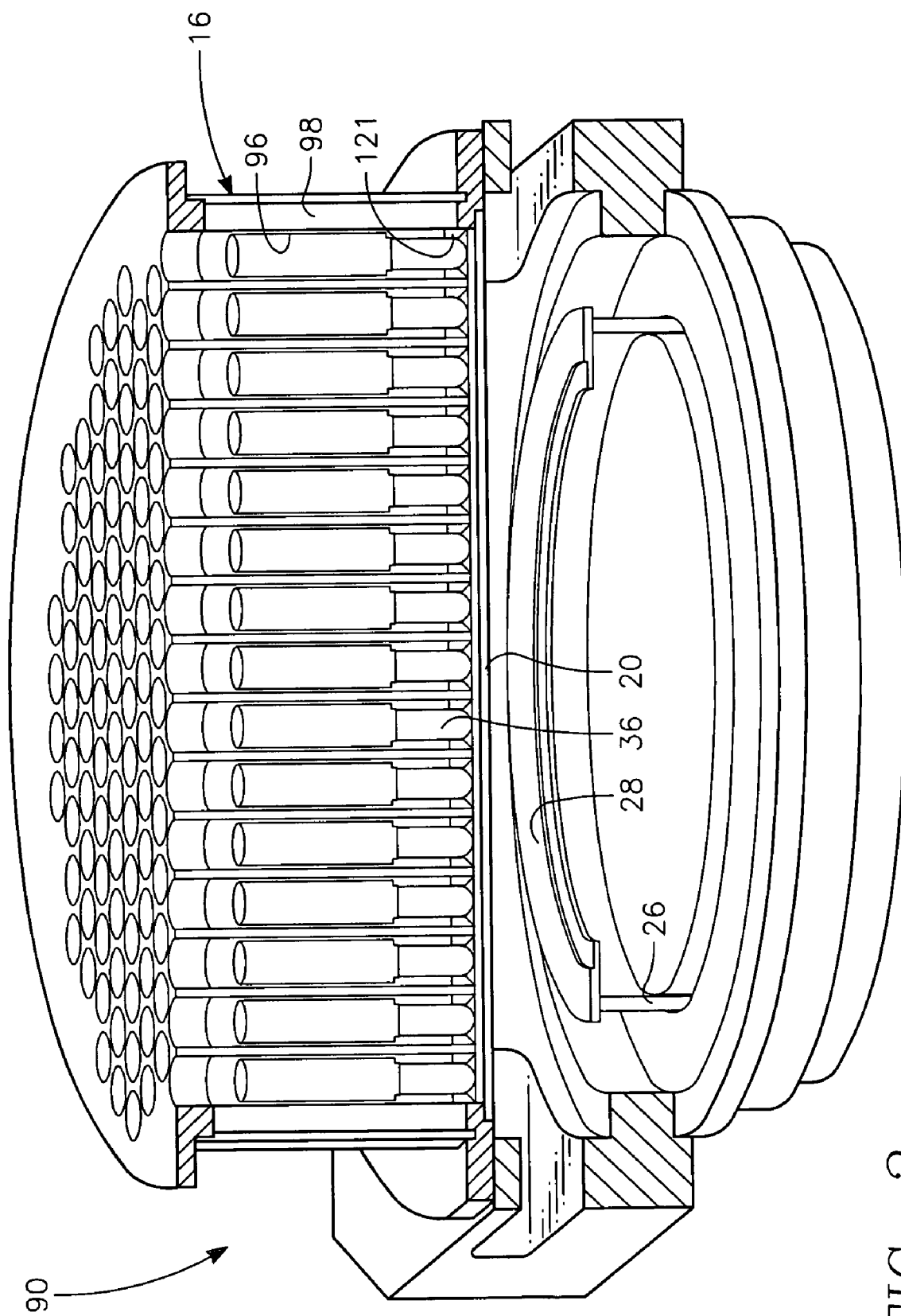
FIG. 2 is a cut-away orthographic view of a thermal processing chamber in accordance with a preferred embodiment.

A more commercial RTP system 90 is illustrated the partially sectioned orthographic view of FIG. 2. The SiC wafer support ring 28 is supported on the rotating quartz cylinder 26. The lamphead 16 faces the wafer and includes the array of tungsten halogen lamps 36 held in tubular stainless steel sleeves 96 potted into a water cooled stainless steel housing. The lamp bulbs protrude beyond the sleeves 96 and the housing 98 into a copper front plate 100 having a similar array of through holes into which are inserted reflectors 121. The thin quartz window 20 is disposed between the open end of the reflectors 121 and the processing space above the wafer.

Figure 3:
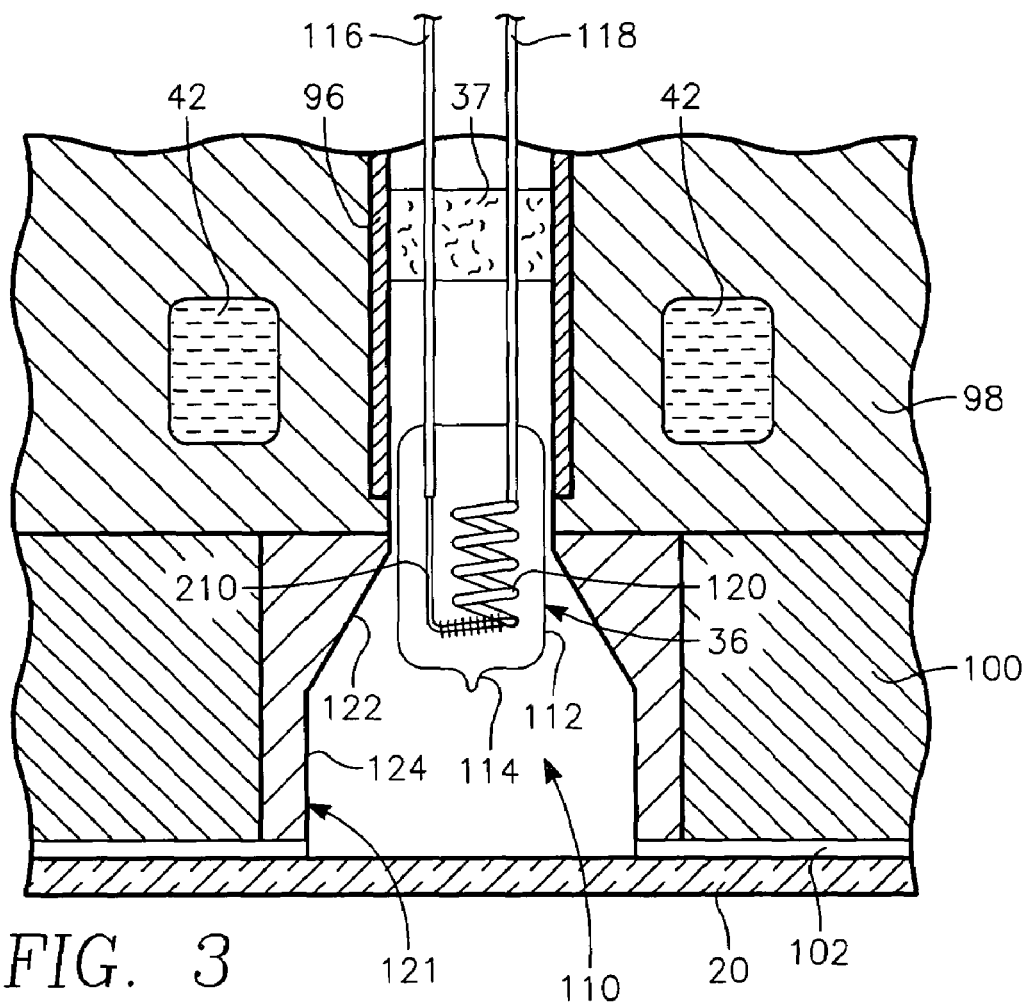
FIG. 3 is a cross-sectional side view of a portion of a lamphead in the chamber of FIG. 2.
Figure 4:
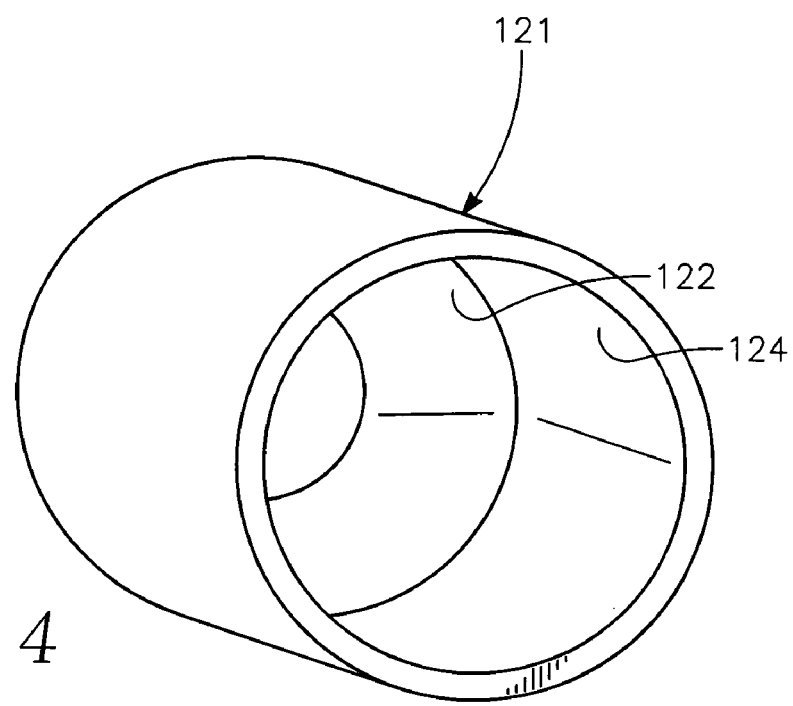
FIG. 4 illustrates a reflector employed in the lamphead of FIG. 2.

An exploded cross-sectional view of a single lamp assembly 110 is illustrated in FIG. 3. The lamp 36 includes a tubular bulb 112 with a nose tip 114. Two filament leads 116, 118 vacuum sealed to the bulb 112 and passing through it support and electrically supply a filament 120. The lamp 36 is held in the stainless steel sleeve 96 by the potting material 37 applied between the leads 116, 118 and fit into the sleeve 96. The sleeve 96 in turn is closely held in the stainless steel water cooled housing 98 including the water filled cooling channels 42. A gold-plated tapered reflector 121, also illustrated orthographically in FIG. 4, includes a conically shaped upper wall 122 and a cylindrically shaped lower wall 124. The reflector 121 is held in the copper front plate 100 fixed to the lower side of the water cooled housing 98 such that the reflector 121 is aligned with the lamp 36. The thin quartz plate 102 is fixed to the front plate 100 and covers the opening of the tapered reflector 120 to permit light to shine from the lamp 36 towards the wafer being processed.

Figure 3A:
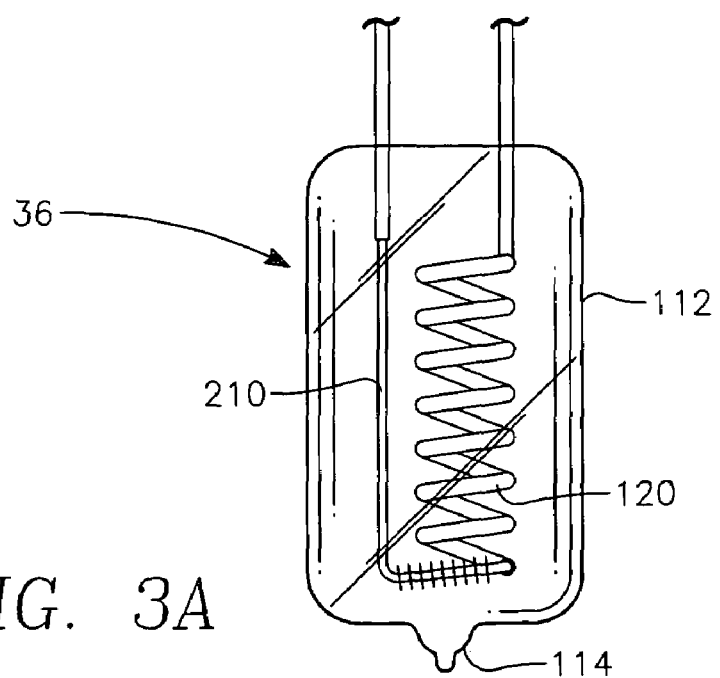
FIG. 3A illustrates a lamp bulb in the lamphead of FIG. 3.

The bulb portion of a preferred lamp 36 rated at 645 W is illustrated in the elevational view of FIG. 3A. The filament 120 is formed in a two-step process. First, a tungsten wire is helically wound with a small radius, for example, 0.25 mm for an outside diameter of 0.5 mm. Then, the wound tungsten wire is helically wound about an axis of the lamp 36 with a larger radius at least five times greater than the smaller radius to produce a doubly helical filament 120. As illustrated, the secondary winding forms about 8.5 turns extending along about 15 mm and its back side is close to the water cooled housing 98.

An alternative filament 120 is formed in a three-step process to produce an overwound filament. First, as illustrated in the cross-sectional view of FIG. 3AA, a thin, e.g., 1 to 2 mil (25 to 50 μm) diameter, tungsten wire 202 is helically wound on a substantially larger tungsten wire 204, e.g., the above 0.5 mm diameter wire, that is, at least five times greater diameter. Then the thicker wire 204 with already wound thinner wire 202 is helically wound, as illustrated in the plan view of FIG. 3AB on a mandrel 206 having a diameter at least five time greater than that of the thicker wire 204 to produce a primary wound structure. The primary wound structure, including the thicker wire 204 and overwound thinner wire 202 in turn is helically wound, as illustrated in the plan view of FIG. 3AC, on a larger mandrel 208 have a diameter at least five times that of the smaller mandrel 206 to form a secondary wound structure. The smaller mandrel 206 may remain during the second winding if it can be removed, e.g., dissolved afterwards. A long inner lead having a larger diameter than the wire composing the coil forms a side arm 210, a shorted inner lead attaches to the other end of the coil. Together with the secondary wound structure after removal of the mandrels, these parts form the overwound coil structure 120. The overwinding has the effect of increasing the effective surface area of the filament 120 and hence increasing its effective emissivity.

The overall structure of the lamp 36 is illustrated orthographically respectively from below and above in FIGS. 3B and 3C and in the cross-sectional view of FIG. 3D including the tubular sleeve 96.

The lamp 36 includes the filament within the quartz bulb 112. The two outer (outside the bulb atmosphere) filament leads 116, 118 (these are conceptually the same as 226 & 228 but obscure the more complex structure of the hermetic press seal) are vacuum sealed to the bulb 112 and on the exterior welded to two Teflon coated filament leads 302, 304. As illustrated in FIG. 3AD, the sealing is accomplished through molybdenum tabs 220 embedded in the press seal portion 221 of the bulb 112. The two terminals of the tungsten filament 120 are led through recesses 224 in the press seal 221 and welded to the tabs 220. Similarly, outer terminals 226 of molybdenum or nickel are led through recesses 228 and also welded to the tabs 220. Only a relatively short portion of the tabs 220 are hermetically sealed by the press seal 221 of the halogen-containing bulb 112. Filament leads 230 (230 is the insulation-stripped part of 302, 304 of FIG. 3D) copper plated with silver or nickel are welded or otherwise joined to the external terminals 226, which may be used for transversing the lamp base 306 of FIGS. 3B and 3C. FIG. 3AD depicts the preferred embodiment of the bulb, whereas FIGS. 3, 3A, 3D and 12-14 depict an alternative embodiment of the bulb. As shown in FIG. 3AD, the press seal portion 221 and the bulb are integrally formed, and the conductor 210 extends through the interior of the coil formed by the filament 120.

Figures 3B, 3C, 3D:
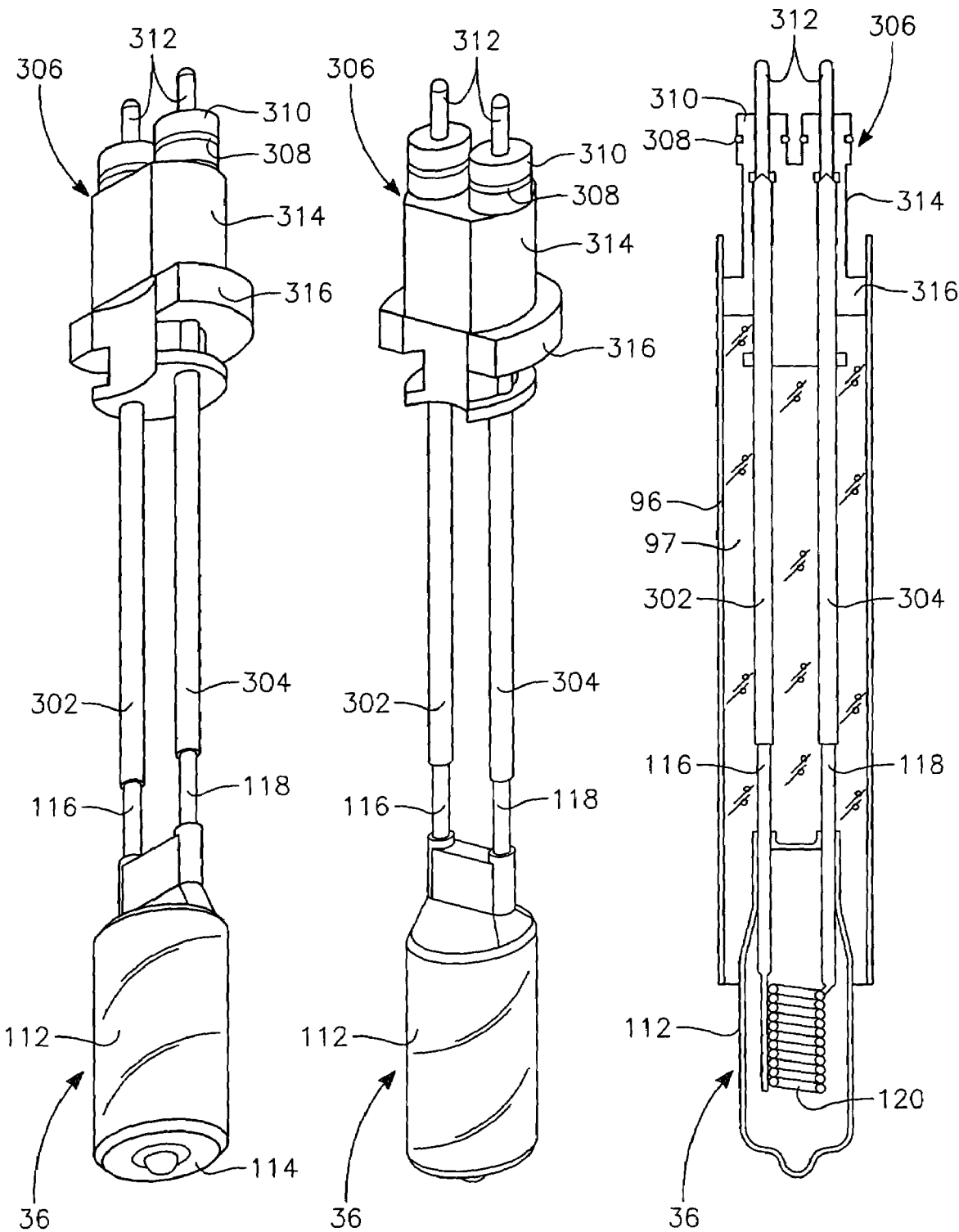
FIGS. 3B and 3C are different orthographic views of a lamp assembly in the lamphead of FIG. 3.
FIG. 3D is a cross-sectional view corresponding to FIGS. 3B and 3C.
Figure 3A:
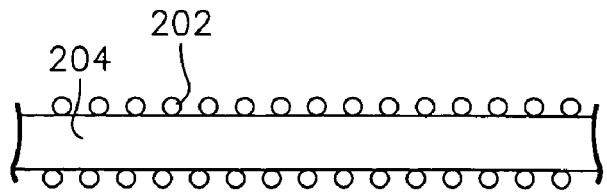
Figure 3A:
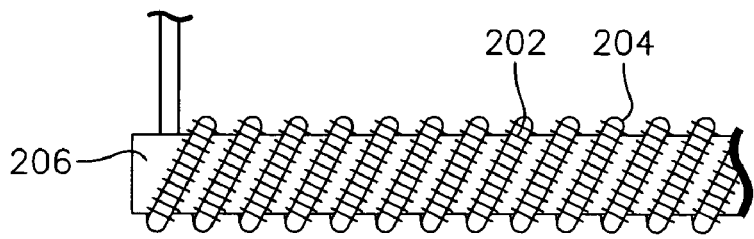
Figure 3A:
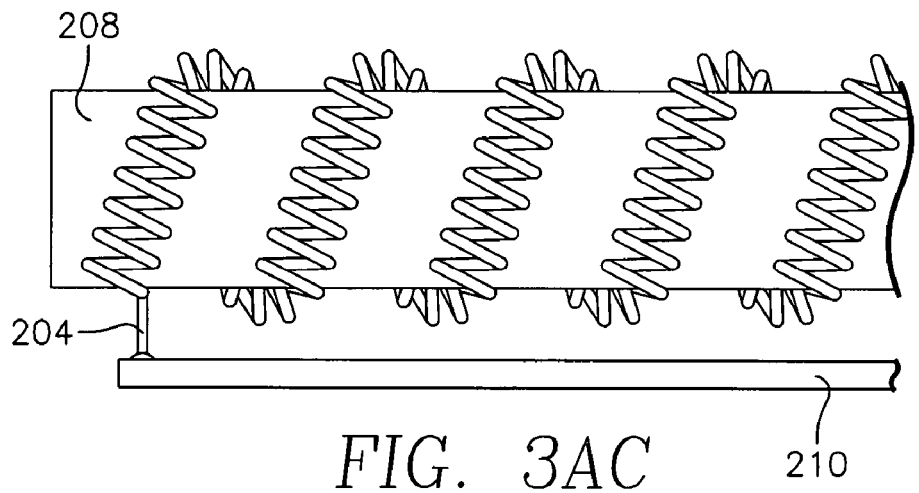
Figure 3A:
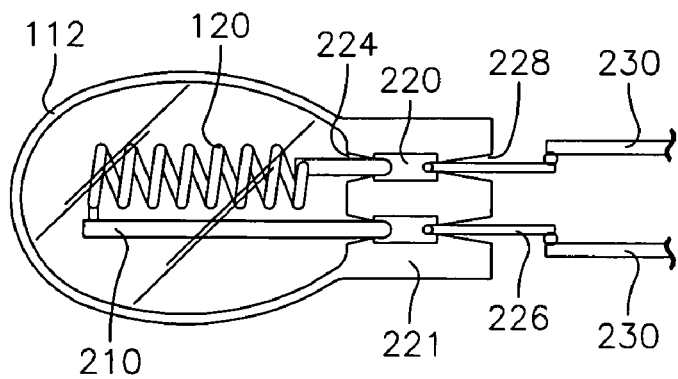

Referring now to FIG. 3D, during the sealing, the bulb 112 is filled with a halogen-containing gas, a process well known in the art. The potting material 97 pots and fixes together the filament leads 302, 304 within the stainless steel sleeve 96. The potting material 97 may be, for example, a hydraulic setting ceramic, e.g. $MgPO_4$, $ZrSiO_4$, $ZrO_2$, $MgO$, or $SiO_2$. An elastomeric or a thermoplastic such as Santoprene, forms a flexible plastic base 306. Advantageously, the potting material 97 is somewhat porous. However, as is evident from FIGS. 3B and 3C, the base 306 may be formed around the leads 302, 304 to form a free standing bulb assembly that is thereafter inserted into the tubular sleeve 96. The base 306 includes two annular recesses for O-rings 308 in two cylindrical stubs 310 seal the lamp 36 in the socket 38 of FIG. 1 especially to prevent plasma to form when the chamber and lamphead are pumped down for low-pressure processing. Two male contacts 312 extend beyond the end of the stubs 310 to be inserted into corresponding female contacts in the socket 38. The base 306 also includes a somewhat cylindrical body portion 314 to be inserted into the sockets 38, typically formed as part of a printed circuit board, and an annular flange 316 to be tightly fitted into and possibly sealed to the tubular sleeve 96 and determining its axial position. The thermoplastic base 306 is flexible enough to allow the male contacts 312 and asssociated structure on the filaments leads 302, 304 to be flexibly mated with a printed circuit board supplying power to the lamp array.

Figure 6:
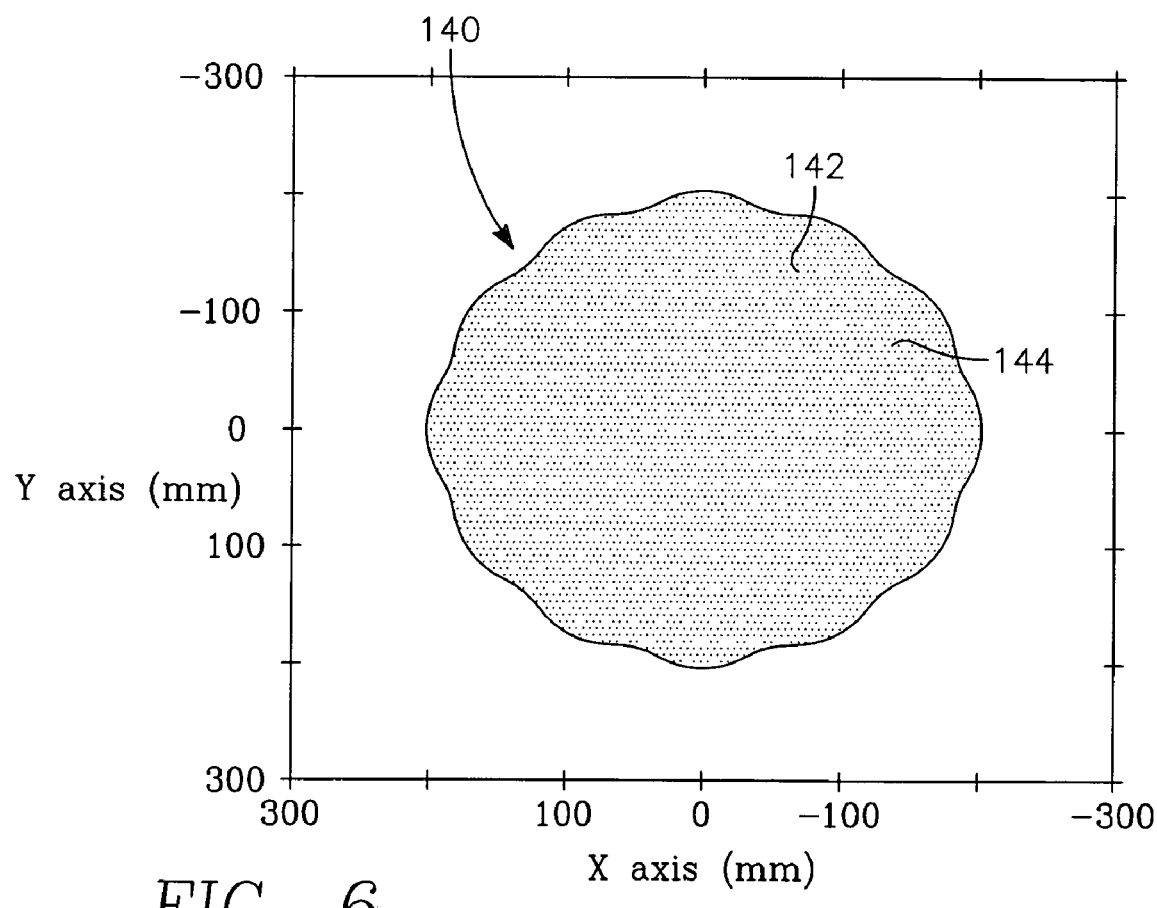
FIG. 6 depicts an irradiance pattern of the lamphead of FIG. 5.
Figure 5:
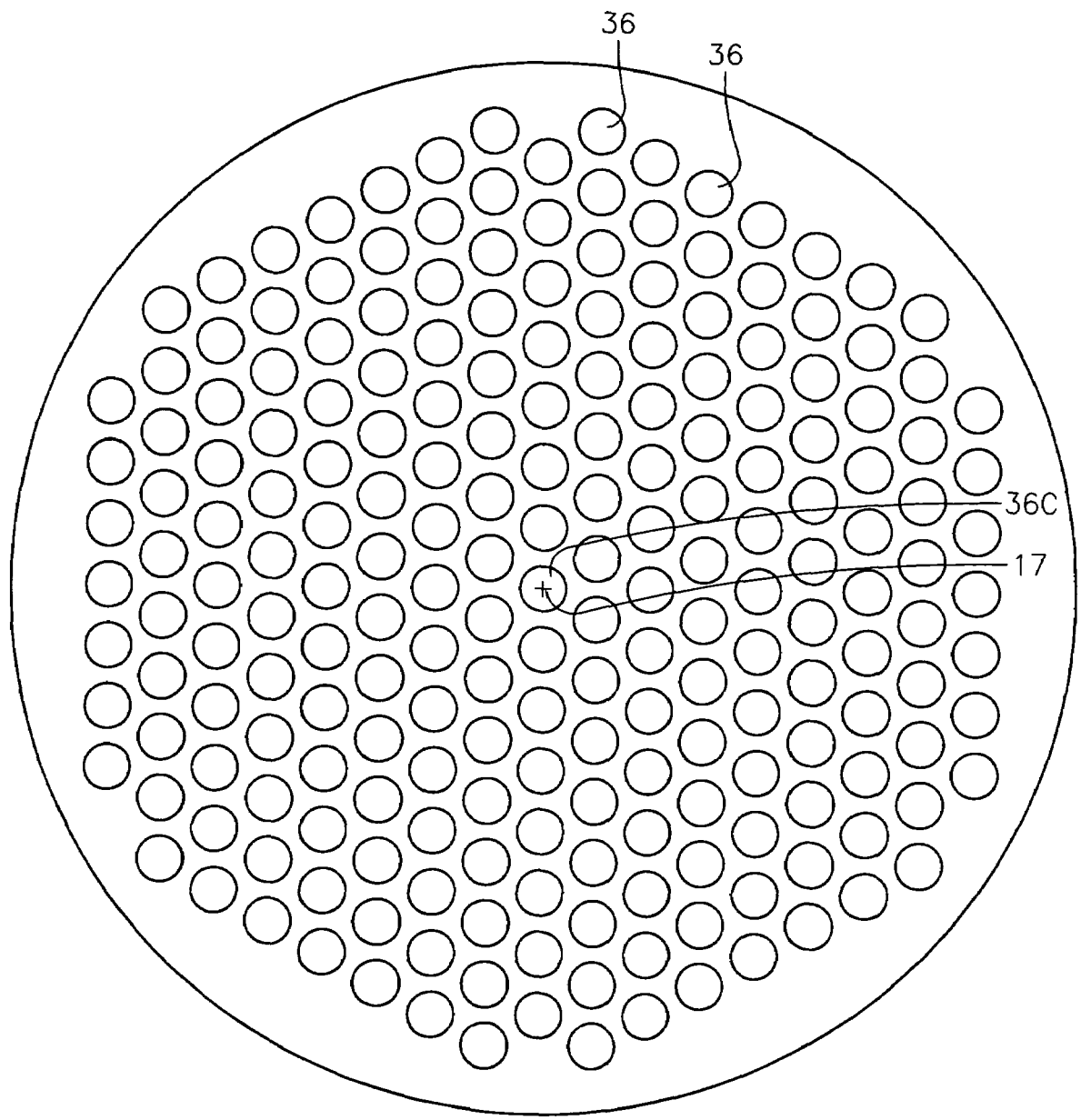
FIG. 5 is a bottom view a lamphead in accordance with one embodiment.

For a 300 mm chamber, 409 lamps 36 are arranged in a hexagonal distribution illustrated in FIG. 5 (although fewer lamps 36 are illustrated there) centered on a center lamp 36C coincident with the chamber's central axis 17. Alternatively, the distribution may be another polygonal shape or circular. The heating zones correspond generally to hexagonal bands centered about the central axis 17, but the central lamp 36C may form a single zone. The radiation pattern 140 output by such an array is illustrated in FIG. 6. It includes a similar hexagonal array of bright spots 142 surrounded by a more diffuse and lower intensity background 144. However, the rotation of the wafer is intended to average out the bright spots 142 to produce a more uniform time-averaged radiation pattern.

Figure 7:
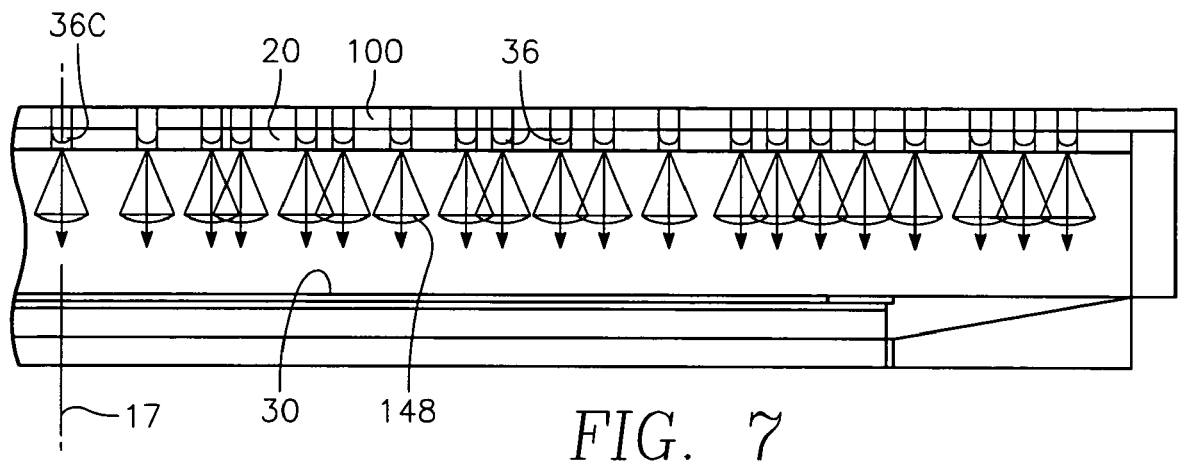
FIG. 7 is a side view of a lamphead of one embodiment.

Such an approach has been very successful. However, both temperature measurements and process results indicate some radial ripple persists in the radiation pattern. Especially, the center of the wafer seems to be excessively heated and a sharp irradiance peak exists there. The ripple can be somewhat reduced by controlling the zone heating to even out the ripples. However, the ripple is still considered excessive and more fundamental solutions to the ripple problem are sought. We believe that a substantial cause of the ripple phenomenon in RTP is caused by two effects. First, the zone immediately surrounding the center lamp 36C does not benefit from wafer rotation since there radiation results there is no other lamp to average over. Secondly, an hexagonal array centered on the center lamp 36C and rotation axis 17 inherently produces radial oscillations, particularly near the center. The schematic cross-sectional view of FIG. 7 taken along a radius of the RTP chamber illustrates the effective radial positions (±2 mm) of all lamps 36 in the hexagonal array and their radiation patterns 148. There are several radii having closely spaced lamps 36 and other radii having a gap. The maldistribution is particularly severe around the center lamp 36C. Although control of the zone heating can reduce the severity of the problem, even 15 zones appear insufficient to completely solve the ripple problem.

Figure 8:
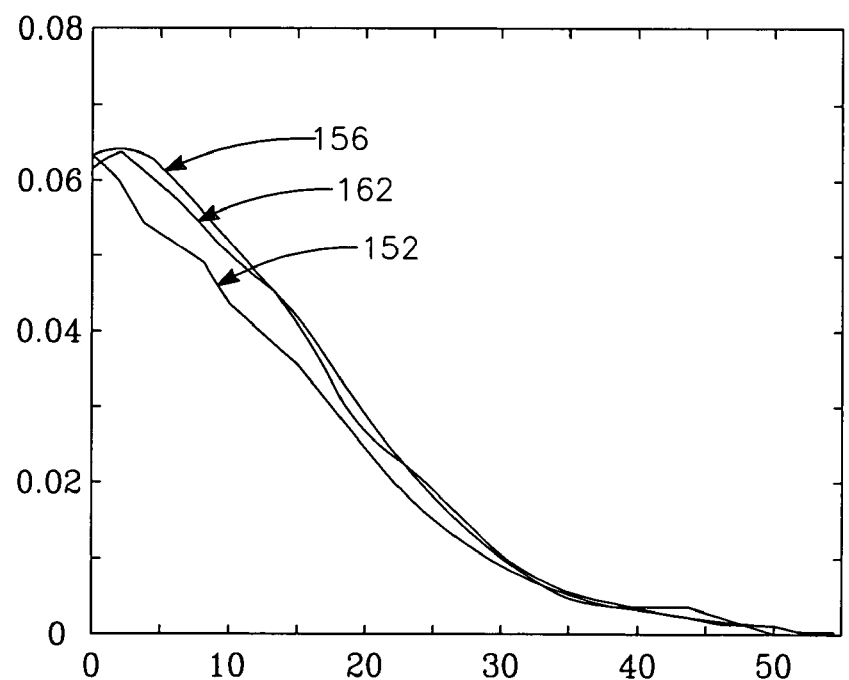
FIG. 8 is a graph of radiation intensity radial profiles for different embodiments.
Figure 9:
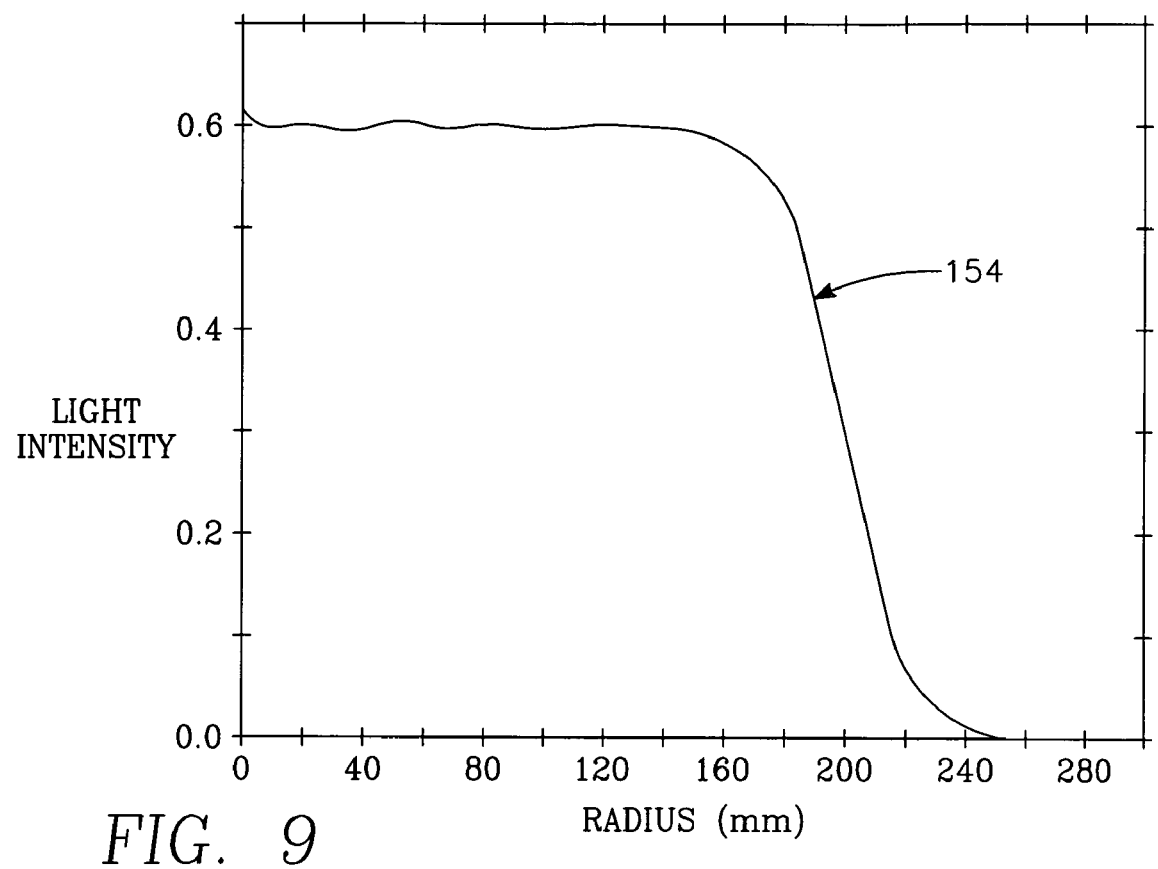
FIG. 9 is a graph of light intensity radial distribution for a preferred embodiment.
Figure 10:
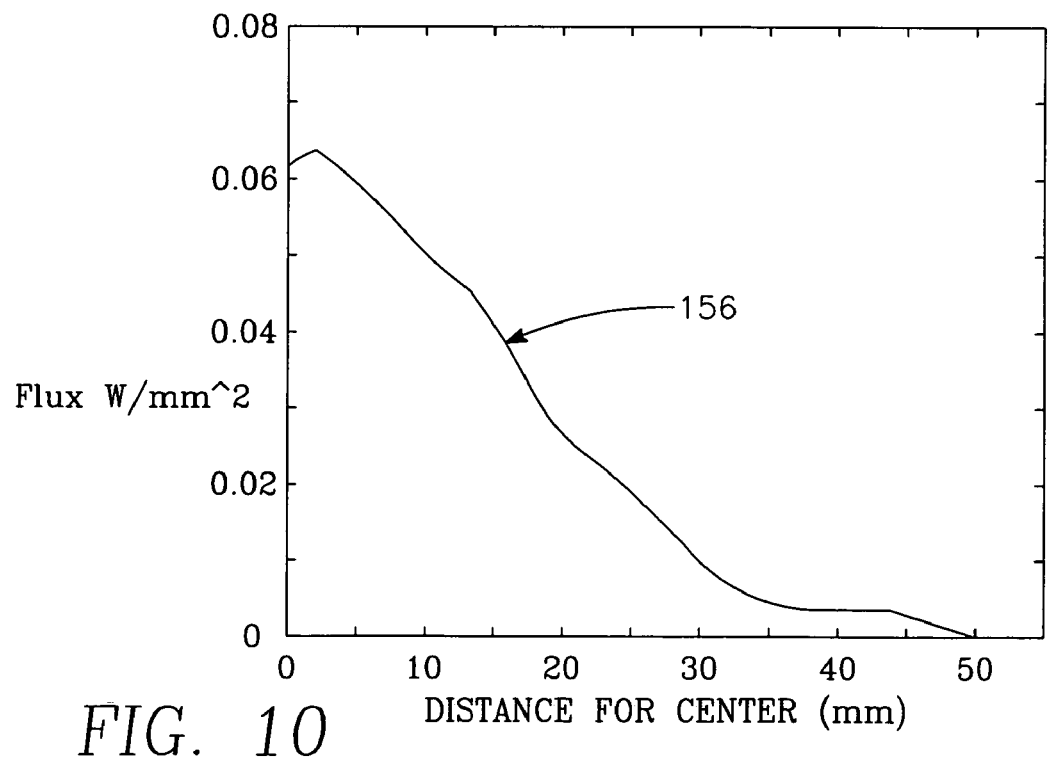
FIG. 10 is a graph of radiation intensity radial profile for another preferred embodiment.

Many simulations have been performed to quantify the geometrical effects of the finite hexagonal arrays. The radiation pattern of a standard lamp has been measured in a plane at distance from the source representative of an RTP chamber and as a function of the transverse direction (radius) from the axis of the lamp within the plane. The helical filament of a standard lamp has about eight turns extending over about 15 mm with the back of the nearest turn disposed adjacent the face of the water cooled housing or in front of it. A standard profile 152 is illustrated in the graph of FIG. 8. A computer program then calculates the total radiation intensity, as illustrated in the graph of FIG. 8 for all 409 lamps at respective positions in the array and averages this distribution for the rotation of the wafer about the center of the lamp array. The resulting total radial profile 154 of FIG. 9 exhibits a distinct peak at the center. Aside from ripple inside 50 mm, it was generally flat outwardly of the center to about 150 mm, as is desired for a 300 mm wafer. The simulation was repeated with the center lamp 36C removed, that is, not contributing any radiation to the total radiation pattern. The difference between a flat profile out to 50 mm and the profile without the center lamp 36C was then calculated to produce an ideal profile 156 for the center lamp 36C, as illustrated in FIGS. 8 and 10.

Accordingly, in one embodiment of the invention, it is desired to replace the center lamp 36C with a non-standard lamp while leaving standard lamps in the remaining sockets. In general, the center lamp 36C should produce a more diffuse pattern than the remaining lamps. This embodiment has the advantage of not requiring modification of the lamphead but only requiring modification of a replaceable lamp. The embodiment further allows all but one of the lamps to be optimized for intensity or other parameter while restricting the ripple improvement to only the center lamp 36C. It is possible to carry the lamp optimization further by separately optimizing the six lamps 36 of the innermost hexagon resulting in three different sets of lamps.

Figure 11:
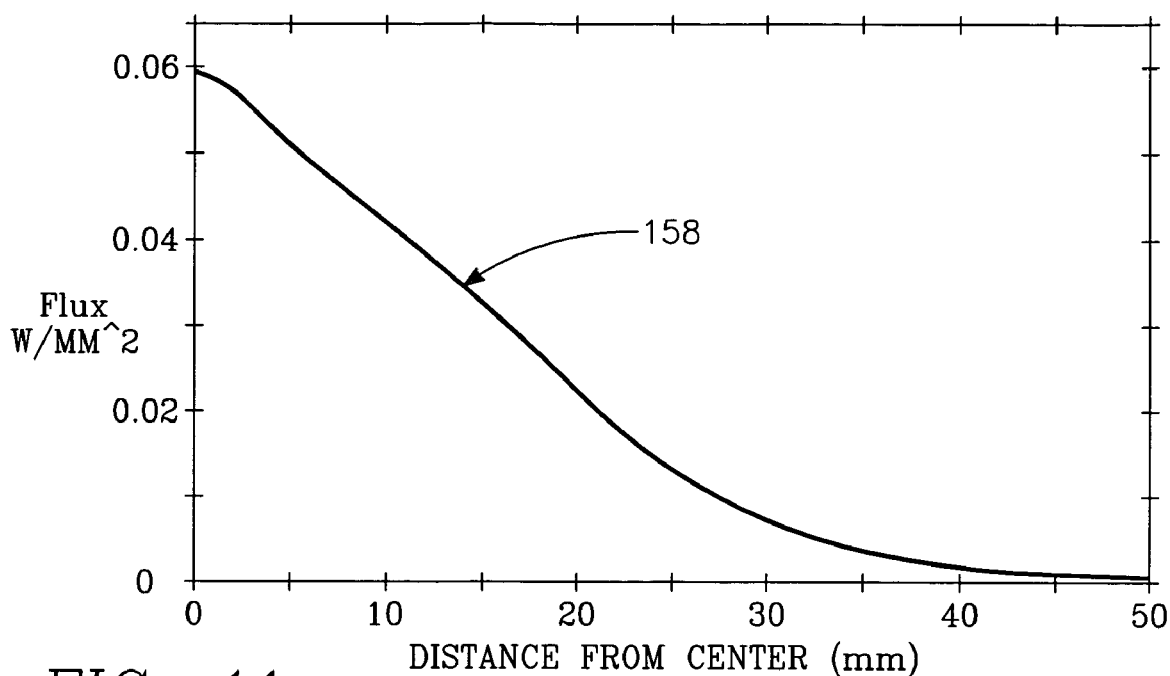
FIG. 11 is a graph of radiation intensity radial profile for yet another preferred embodiment.

A more diffuse lamp may be produced by increasing the light center length, that is, the distance of the filament 120 from the water cooled housing 98. The distance can be increased by increasing the length of the filament leads 116, 118 or simply by adjusting where the leads 116, 118 are potted into the sleeve 96. A diffuse profile 158 is illustrated in the graph of FIG. 11 for a lamp having the light center length (distance from back of filament 120 to the water cooled housing 98) increased from about 0 mm to about 4.7 mm.

Figure 12:
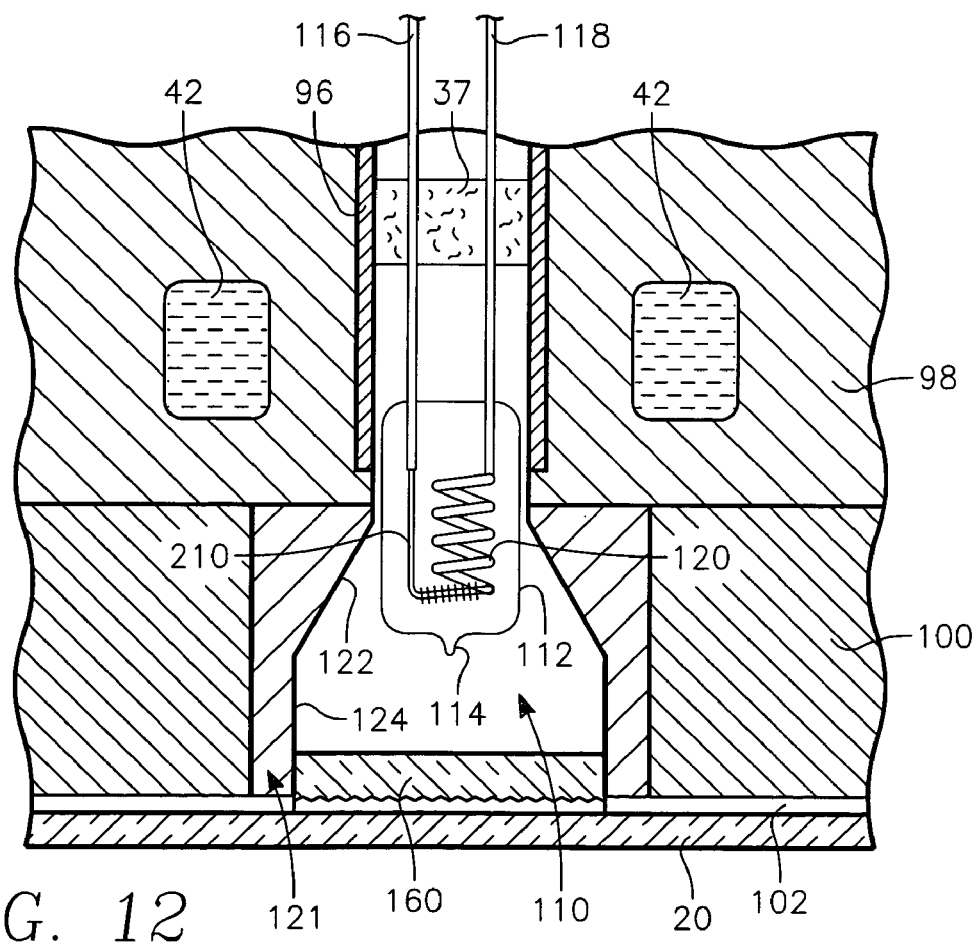
FIG. 12 is a cross-sectional side view of a portion of a lamphead in accordance with a preferred embodiment.

Another approach for diffusing the light is to place roughened quartz disk 160 or other roughened transmissive high-temperature material within the lower bore of the tapered reflector 120, as illustrated in the cross sectional view of FIG. 12, or at some other point between the lamp and the processing zone. The disk 160 can be roughened on the lower side (as illustrated), on the upper side, or on both sides by bead blasting or other techniques such as sintering or cementing fine powder to the bulb, or quartz containing dispersed zirconia. A resulting profile 162 is illustrated in the graph of FIG. 8.

Figure 13:
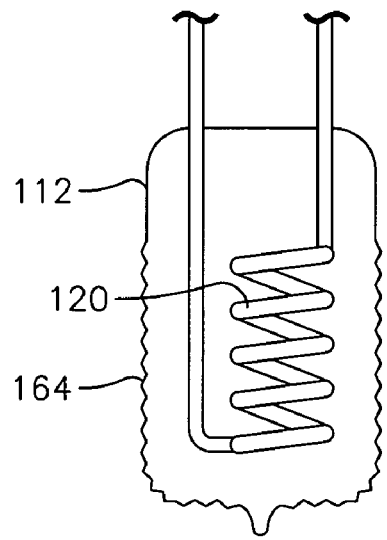
FIG. 13 depicts one embodiment of a lamp having a diffuse pattern.
Figure 14:
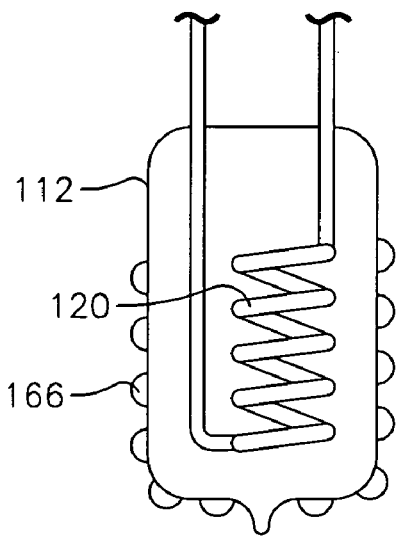
FIG. 14 depicts another embodiment of a lamp having a diffuse pattern.

Further techniques include, illustrated in the cross-sectional view of FIG. 13, roughening a light emitting portion 164 of the bulb 112 near the filament 120 or, as illustrated in the cross-sectional view of FIG. 14, coating that portion with a diffusing material 166, whether having a diffusive characteristic and uniform thickness or having a refractive texture.

Figure 15A:
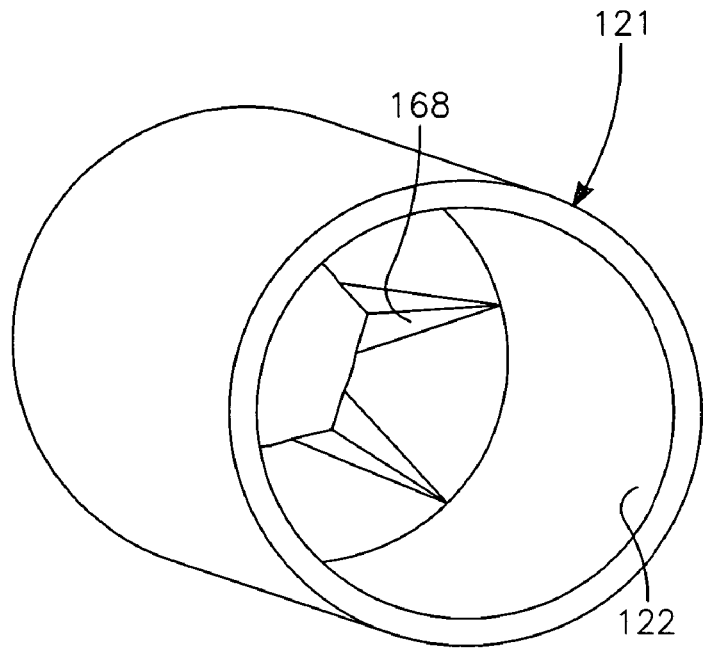
FIGS. 15A and 15B depict embodiments of lamp reflectors for diffusing the lamp radiation.
Figure 15B:
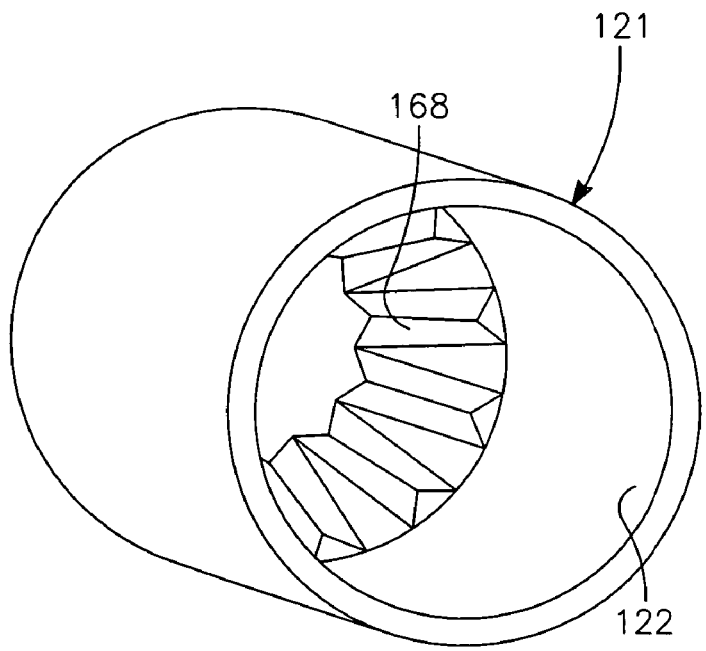

A yet further technique for diffusing the light, illustrated in the orthographic views of FIGS. 15A and 15B, machines facets 168 into the taper wall 122 of the tapered reflector 121.

The choice of a moderately diffuse or highly diffuse lamp produced by moving the filament or the use of a singly or doubly sided diffusing disk may depend upon the process and recipe to which the modified center lamp is being applied since a change of recipe is not desired, only an improvement of center temperature for the already developed and commercialized recipe.

The opposite of altering a lamp to make it more diffuse is altering it to be more collimated, that is, less diffuse. A normal lamp 36 can be made collimated by withdrawing the filament 120 partially within the tubular sleeve 96 so that the sleeve somewhat collimates the lamp's output. An example of a collimated lamp used in the calculations below places the back of the filament 120 about 2 mm behind the face of the water cooled housing 98.

Figure 16:
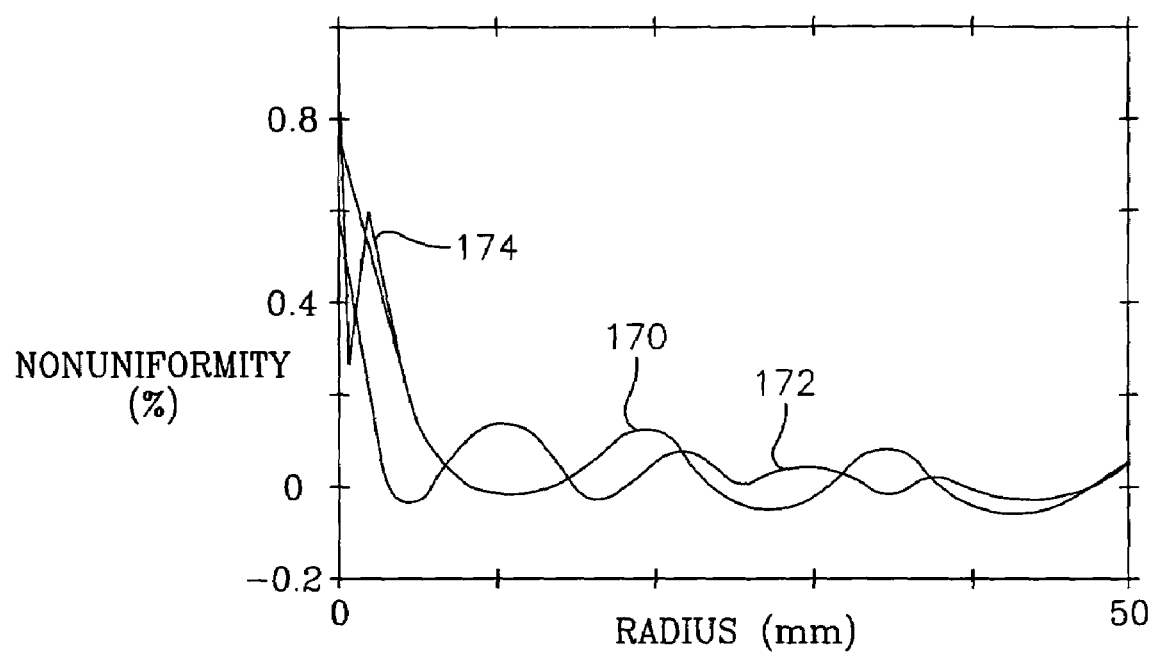
FIG. 16 is a graph of radiation radial non-uniformity for different embodiments.

Replacing the center lamp is useful for suppressing the center peak but is less effective at suppressing the ripple at somewhat larger radii, for example, out to 50 mm. Simulations were performed to obtain a normal non-uniformity profile 170, illustrated in the graph of FIG. 16, when normal bulbs occupy all sockets in the hexagonal lamphead array. In contrast, a diffuse non-uniformity profile 172 is obtained when diffuse bulbs occupy all the sockets. In the latter case, the center peak is reduced but the ripple is shifted without being significantly suppressed. To provide further comparison, a collimated lamp was constructed in which the filament 120 is withdrawn within the tubular sleeve 96 such that the back of the coil is about 2 mm above the bottom of the sleeve 96 to provide a radiation pattern more collimated and less diffuse than that provided by a normal bulb, that is, a narrower beam on the wafer. In the simulation, a collimated non-uniformity profile 174 is produced when collimated lamps occupy all sockets in the array. The collimated profile 174 exhibits a two strong peaks at the center and a few millimeters outwardly. Thereafter, it does not greatly deviate from the normal profile 170.

Figure 16A:
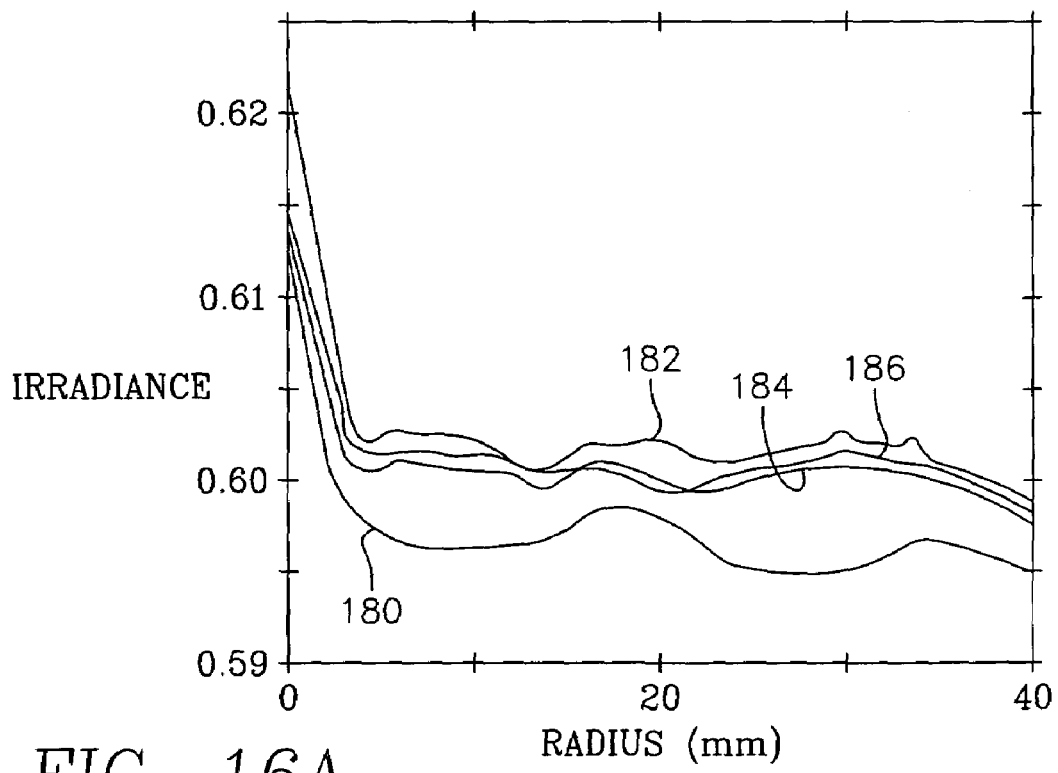
FIG. 16A depicts the radial profile of irradiance for different embodiments.

Although none of the profiles are satisfactory, significant reductions in ripple can be obtained if certain combinations of normal, diffuse, and collimated bulbs populate the lamphead array. A first IN in combination alternates collimated and diffuse lamps. For comparison, an irradiance profile 180 with all normal lamps in the array is shown in the graph of FIG. 16A. The alternation may be performed for the lamps 36 situated around the hexagons centered on the center lamp 36C, as illustrated in the plan view of FIG. 17, which shows by X's the lamps 36 in first three hexagons (marked by linking lines) which are diffuse lamps with the unmarked lamps 36 being collimated lamps. Similar alternation is performed for the outer hexagons. In the first combination, the center lamp 36C is a collimated lamp. A resulting profile 182 shows a center peak and a weaker peak somewhat inwards before settling down to a ripple. The size of the ripple which is quantized as Delta, defined as the max-min for the biggest ripple excluding the center peak is 0.004143 for the normal profile 180, which is 0.69% of the mean value of the data set. A first combination profile 182 for the first combination of lamps produces a Delta of 0.002959, which is 0.49% of the mean value of the data set of the first combination. Thus, the first combination reduces the ripple non-uniformity by 29% relative to the all-normal population.

Figure 17:
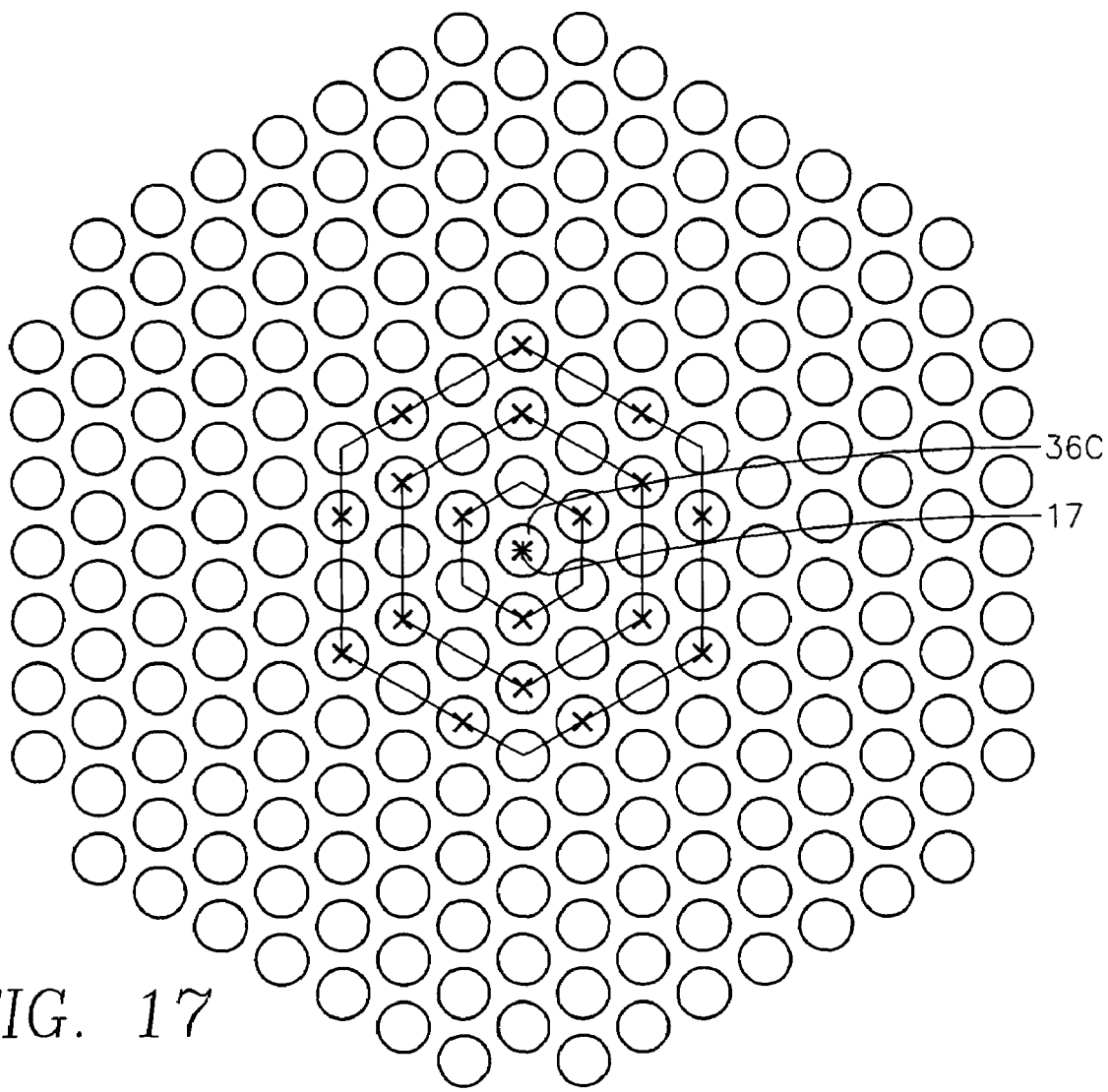
FIG. 17 illustrates a lamphead having a pattern of lamps with different radiation patterns.

A second combination alternates normal and diffused lamps 36, distributed as in FIG. 17, but the center lamp 36C is normal. A resultant second combination profile 184 in FIG. 16A exhibits a Delta of 0.002996, which is 0.49% of the mean value of this combination. Thereby, the ripple non-uniformity is reduced 29% compared to the normal lamp distribution.

A third combination alternates normal and diffused lamps with the exception of heating zone 1 (first hexagon), in which one otherwise normal lamp is made diffused, and the center lamp 36C is normal. A resultant third combination profile 186 exhibits a Delta of 0.003383, which is 0.56% of the mean value of the normal population. Thereby, the non-uniformity ripple is reduced 19% compared to the all-normal population.

The previously described methods for reducing ripple in the radiation pattern from the lamp array have the advantage of requiring only modification of the lamps and may be retrofitted onto existing reactors. A more fundamental approach recognizes that the inherent drawback of the hexagonal arrangement of lamps 36 illustrated in FIG. 5 which is symmetric about the wafer rotation axis 17 and the center lamp 36C is located on the rotation axis 17. Because of the finite number of light sources with significant distances between them, the central symmetry, even after wafer rotation inevitably produces bands of high and low intensity radiation, that is, ripple. The effect is particularly pronounced near the center lamp 36C.

Figure 18:
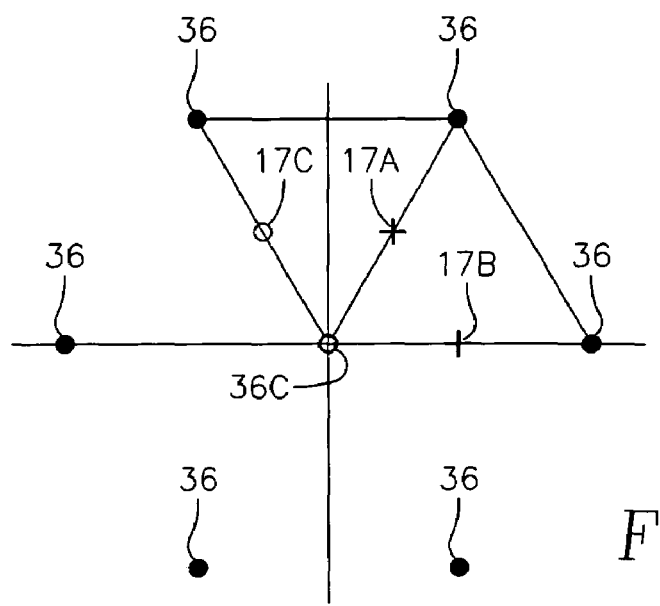
FIG. 18 illustrates the off-center placement of the wafer rotation axis relative to a lamphead similar to FIG. 17.

The inherent ripple effect can be reduced, as schematically illustrated in the plan view of FIG. 18 by moving the wafer rotation axis away from the center lamp 36C or more precisely to displace the hexagonal array from the rotation axis. As illustrated in the schematic diagram of FIG. 18, the unit cell of an hexagonal array is a diamond having interior angles of 60° and 120°, which may be decomposed into the two triangles of FIG. 18. Lamps 36 are located at the four vertices of the diamond. In this embodiment, the rotation axis 17 is moved away from the vertex of the diamond, that is, away from any lamp.

Figure 19:
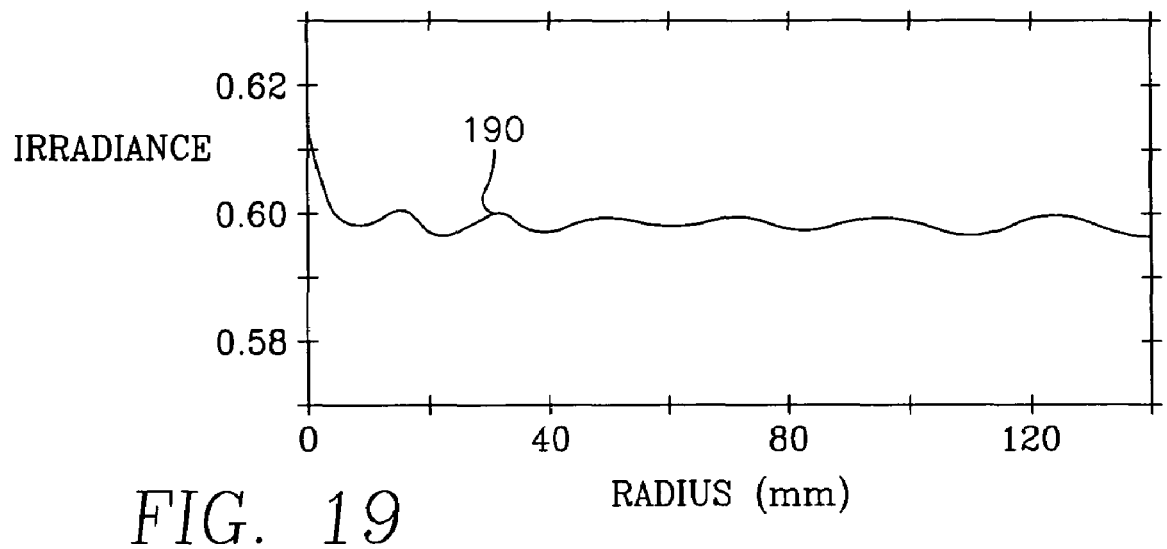
FIG. 19 is a graph of irradiance radial profile for one embodiment.
Figure 20:
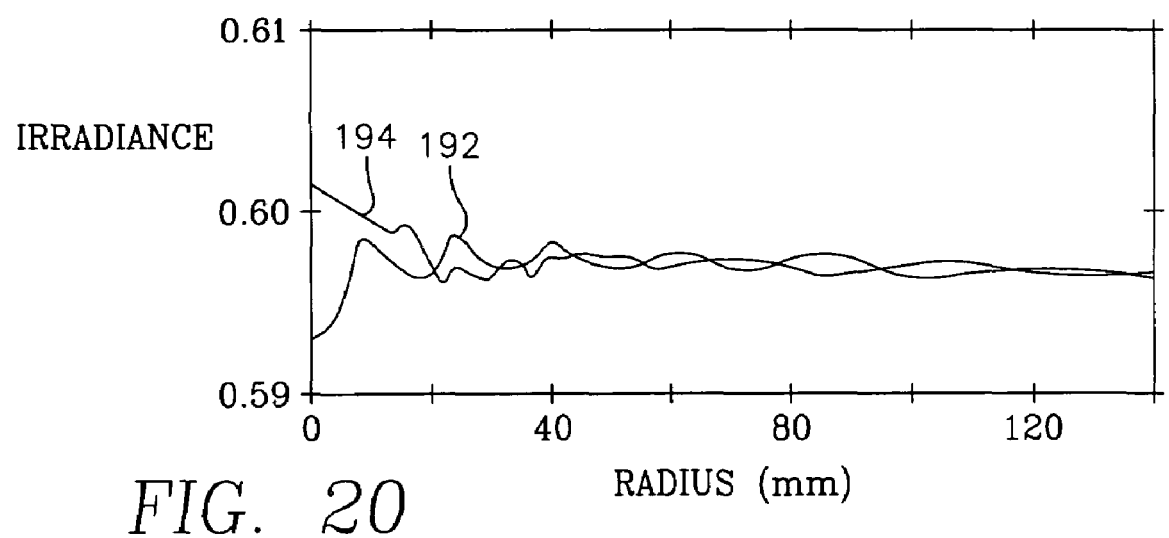
FIG. 20 is a graph of irradiance radial profiles for two different embodiments.

An irradiance profile 190 is illustrated in the graph of FIG. 19 for an hexagonal array of normal lamps with the wafer rotation axis 17 coincident with the center lamp 36C. It exhibits a strong central peak and significant ripple extending out to at least 140 mm. In a first modification of the lamphead in combination with the RTP reactor, a wafer rotation axis 17A is located at the center of the lamp array diamond. A resultant irradiance profile 192 is illustrated in the graph of FIG. 20 with the same units as in FIG. 19. It exhibits substantially reduced ripple and the center peak has been changed to a center trough, though not of great depth. In a second modification of the lamphead, a wafer rotation axis 17B is located midway on the side of the array diamond A resultant irradiance profile 194 exhibits a noticeable center peak but the ripple is about the same as in the first profile 192, though with somewhat different locations. The difference between the two profiles is believed to arise at least in part by the shadow cast by the long inner lead 210, which was included in the 2-dimensional lamp profile, and which is maintained at the same angle for all lamps 36 in the array. An irradiance profile for rotation axis 17C was calculated to exhibit the center trough of rotation axis 17A but ripple close to that for rotation axis 17B. It is believed that the ripple, peaks and troughs can be further averaged out by moving the rotation axis to some other point in the lamp array, for example, somewhere along the line connecting the points 17A, 17B, or 17C or away from the triangular symmetry point.

Translation of the rotation axis away from the center lamp 36C may be accomplished by modifying the reflector 16 of FIG. 1 so that its center lamp is displaced away from the center axis 17 of the chamber. The modifications may include changing the outer periphery of the hexagonal array and may further include changes in the locations of the heating zones in the array.

It is possible to combine the off-center rotation of the wafer with a predetermined distribution of lamp characteristics in the lamp array, such as one of the predetermined distributions of lamp characteristics as the first, second or third combinations described above.

While the invention has been described in detail by specific reference to preferred embodiments, it is understood that variations and modifications thereof may be made without departing from the true spirit and scope of the invention.

What is claimed is:

1. A lamp array for thermal processing comprising a plurality of lamps distributed in an array, said lamps having a predetermined difference in radiance pattern between them, wherein said radiance pattern includes a variation in diffuseness or collimation;
   wherein a first lamp located near a center of said array has a first radiance pattern and the others of said lamps in said array have a second radiance pattern less diffuse than said first radiance pattern; and
   wherein said first lamp additionally contains a diffusing disk.

2. The array of claim 1, wherein said difference in radiance pattern is produced by a predetermined difference in axial positions of incandescent filaments relative to reflective surfaces.

3. The array of claim 1, wherein selected ones of said lamps have diffusing surfaces in accordance with said difference in radiance pattern.

4. The array of claim 1, wherein locations of said lamps in said array correspond to plural concentric polygons or circles, adjacent lamps of each polygon having different lamp irradiance profiles.

5. A chamber for thermal processing a workpiece, said chamber containing a lamp array, said lamp array comprising a plurality of lamps distributed in an array, said lamps having a predetermined difference in radiance pattern between them;
   wherein a substrate irradiated by said array is rotated about a center axis of said array; and
   wherein a center lamp coincident with said center axis is more diffuse than other lamps of said array.

6. A thermal processing chamber, comprising:
   a substrate support rotatable about a center axis; and
   a lamphead comprising a plurality of lamps in an array to illuminate a substrate disposed on said substrate support, center lines of all of said lamps being disposed away from said center axis, said lamps having a predetermined difference in radiance pattern between them;
   wherein a first lamp coincident with said center axis is more diffuse than other lamps of said array.

7. The chamber of claim 6, wherein said array is an hexagonal array.

8. The chamber of claim 6, wherein said center axis is located at a predetermined position between neighboring ones of said lamps.

9. The array of claim 6, wherein said radiance pattern includes a variation in diffuseness or collimation.

* * * * *